United States Patent [19]

Tateishi

[11] Patent Number: 5,748,045
[45] Date of Patent: May 5, 1998

[54] DIGITAL PLL CIRCUIT

[75] Inventor: Kiyoshi Tateishi, Tsurugashima, Japan

[73] Assignee: Pioneer Electronic Corporation, Tokyo, Japan

[21] Appl. No.: 664,620

[22] Filed: Jun. 18, 1996

[30] Foreign Application Priority Data

Jul. 6, 1995 [JP] Japan ................. 7-170837

[51] Int. Cl.[6] ................. H03L 7/06; H03L 7/08
[52] U.S. Cl. ................. 331/17; 331/14; 331/25
[58] Field of Search ................. 331/14, 17, 18, 331/25; 360/51

[56] References Cited

U.S. PATENT DOCUMENTS

5,325,093  6/1994  Takamhori ................. 341/155
5,373,258  12/1994  Gerot et al. ................. 331/14

Primary Examiner—Timothy P. Callahan
Assistant Examiner—An T. Luu
Attorney, Agent, or Firm—Sughrue, Mion, Zinn, Macpeak & Seas, PLLC

[57] ABSTRACT

Disclosed is a digital PLL circuit which can permit voltage level conversion using pulse width modulation by a PWM circuit to thereby ensure lower consumed power and a lower implementation density even when the transitional change of the phase error signal is not constant. A phase error signal is obtained based on sample values acquired by sampling a read signal read from a recording medium, and an average phase error signal corresponding to the average value of this phase error signal is obtained. Then, this average phase error signal is sampled and held at a predetermined clock timing to acquire a sampled average phase error signal which is in turn subjected to pulse width modulation for each mentioned predetermined clock timing. A clock signal whose oscillation frequency corresponds to the average voltage level of the resultant pulse width modulation signal is produced as the aforementioned reproduction clock signal.

4 Claims, 7 Drawing Sheets

DIGITAL PLL CIRCUIT

BACKGROUND OF THE INVENTION

1. Field of the Invention

The present invention relates to a PLL (Phase Locked Loop) circuit for use in a recorded information reproducing apparatus.

2. Description of Background Information

Figure 1:
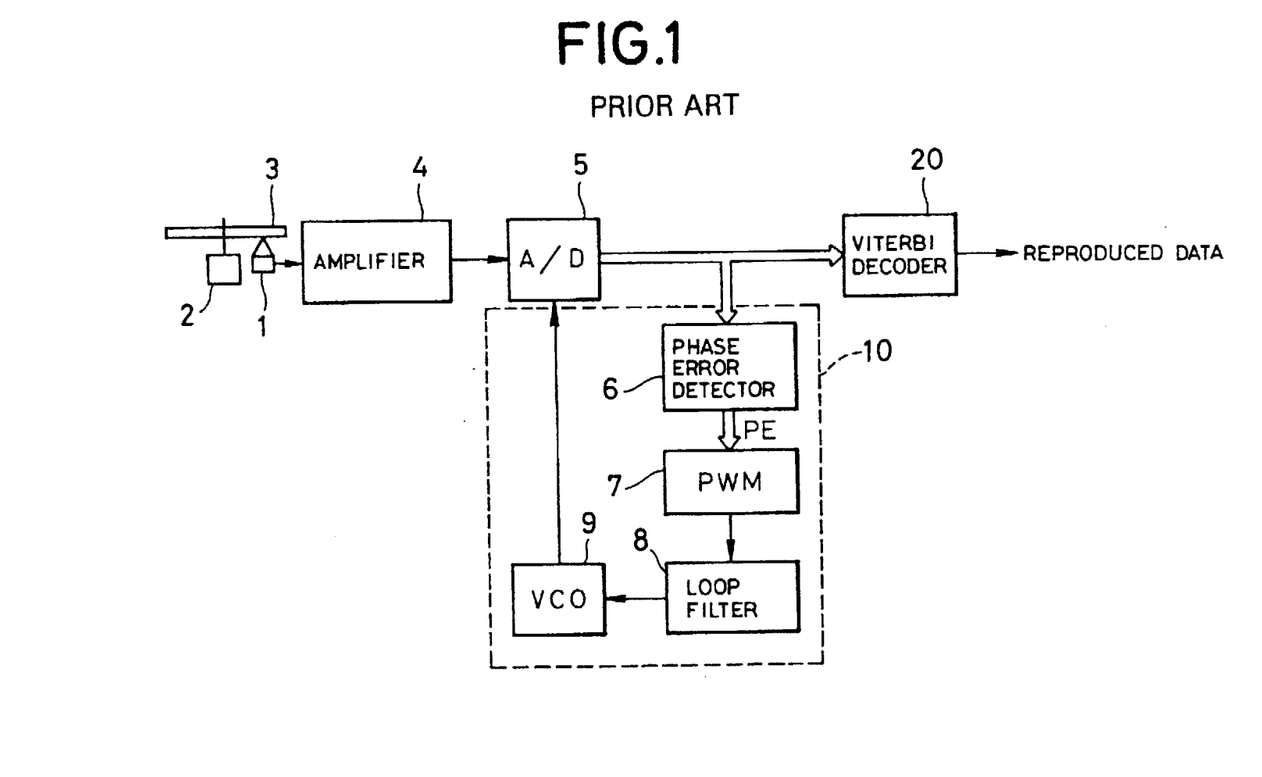
FIG. 1 is a diagram showing the structure of a recorded information reproducing apparatus.

An example of the structure of a recorded information reproducing apparatus equipped with a PLL circuit is illustrated in FIG. 1.

In FIG. 1, a pickup 1 reads information recorded on a recording disk 3 which is rotated by a spindle motor 2, and supplies a read signal corresponding to the recorded information to a head amplifier 4. It is to be noted that a sync signal is recorded on the recording disk 3 together with an information signal as such recorded information for each read period N. The head amplifier 4 amplifies the received read signal by a desired factor and sends the amplified read signal to an A/D converter 5. The A/D converter 5 samples the amplified read signal in accordance with the timing of a reproduction clock signal, supplied from a PLL circuit 10, to convert the amplified read signal to a digital sample value, which corresponds to the signal level of the amplified read signal and consists of, for example, 8 bits. The A/D converter 5 supplies this sample value to the PLL circuit 10 and a Viterbi decoder 20. The Viterbi decoder 20 treats sample values q supplied from the A/D converter 5 as a continuous time sequence, acquires a decoded data sequence with the highest probability of existence with respect to the sample value sequence, and outputs the decoded data sequence as a reproduced data signal.

A phase error detector 6 in the PLL circuit 10 extracts a sample value corresponding to a sync signal from the sample values sequentially supplied from the A/D converter 5, and detects a phase error in the aforementioned read signal based on this extracted sample value. The phase error detector 6 supplies a digital phase error signal PE, which corresponds to the detected phase error and consists of, for example, 8 bits, to a PWM (Pulse Width Modulation) circuit 7.

The PWM circuit 7 generates a pulse width modulation signal having a pulse width corresponding to this phase error signal PE for each reference pulse period, and sends it to a loop filter 8. A PWM circuit adapted to a PLL circuit for a down converter, disclosed in Japanese Patent Kokai (laying open) No. 63-99858, is known as this PWM circuit 7.

Figure 2:
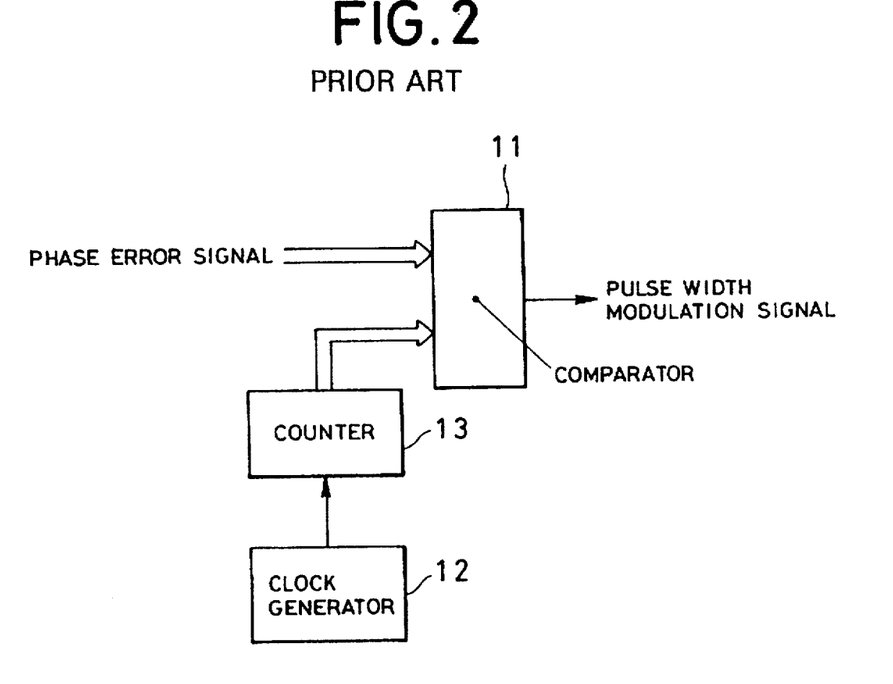
FIG. 2 is a diagram exemplifying the structure of a PWM circuit 7.

FIG. 2 shows the structure of the PWM circuit disclosed in Japanese Patent Kokai No. 63-99858.

Referring to FIG. 2, a counter 13 counts the number of pulses of a clock signal generated by a clock generator 12, and supplies this count value to a level comparator 11. At this time, when the count value reaches a predetermined maximum value, the counter 13 resets the count value to 0 and repeats the count operation. The repeating period of this count operation becomes the period of a pulse width modulation signal. The level comparator 11 compares the count value with the phase error signal. When the phase error signal is greater than the count value, the level comparator 11 generates a high-level signal having a given level and outputs this signal as the pulse width modulation signal. When the phase error signal is smaller than the count value, on the other hand, the level comparator 11 generates a low-level signal having a level lower than the high-level signal and outputs this signal as the pulse width modulation signal.

Figure 3:
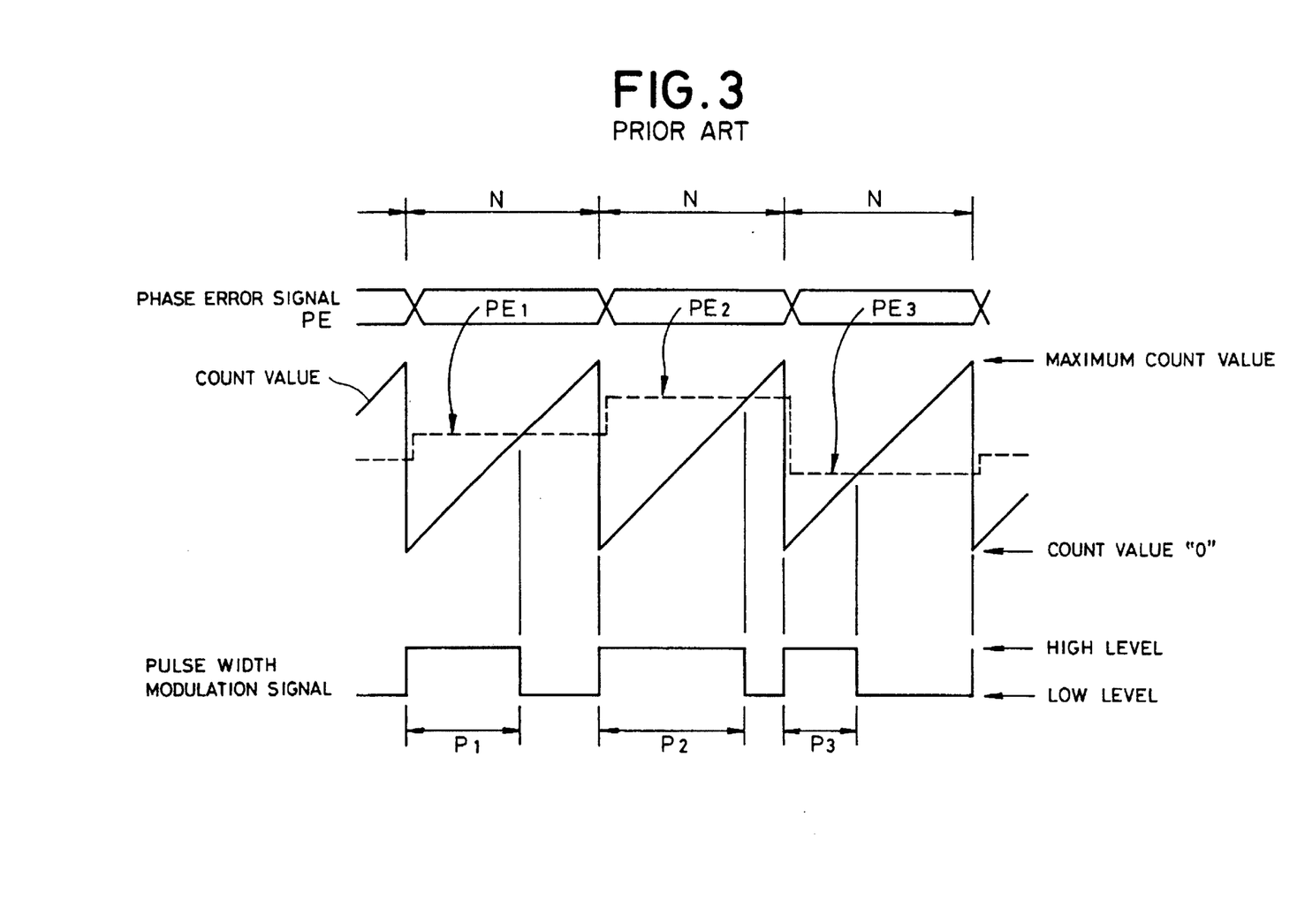
FIG. 3 is a diagram illustrating an example of the operation of the PWM circuit 7.

FIG. 3 illustrates the operation of the PWM circuit 7 which has the structure shown in FIG. 2.

In FIG. 3, the phase error detector 6 extracts a sample value corresponding to a sync signal from the sample values corresponding to read signals which are sequentially supplied from the A/D converter 5, and sequentially supplies phase error signals $PE_1$ to $PE_3$, acquired based on the extracted sample value, to the PWM circuit 7. As the sync signal is acquired for each read period N, each of those phase error signals $PE_1$ to $PE_3$ is produced every period N. The counter 13 in the PWM circuit 7 is so set that the time needed for the count value to reach the maximum from 0 becomes the same as the period N. Therefore, the count value shows a sawtooth-like transitional change with the period N as shown in FIG. 3. It is assumed here that the phase error signals $PE_1$ to $PE_3$ have levels as indicated by broken lines in FIG. 3 with respect to such a count value. The level comparator 11 generates a pulse width modulation signal whose level becomes high only in periods $P_1$, $P_2$ and $P_3$ where the values of the phase error signals $PE_1$ to $PE_3$ are greater than the count value. In other words, the ratio of the high-level duration of the pulse width modulation signal in the period N increases as the value of the phase error signal becomes greater, and the ratio of the low-level duration of the pulse width modulation signal in the period N increases as this value becomes smaller. As the ratio of the high-level duration increases, the average voltage level of the pulse width modulation signal increases.

The loop filter 8 executes phase compensation on the pulse width modulation signal and supplies the signal obtained in the phase compensation to a VCO (Voltage Controlled Oscillator) 9. The VCO 9 generates a clock signal having an oscillation frequency corresponding to the average voltage level of the pulse width modulation signal that has undergone phase compensation in the loop filter 8, and sends this clock signal as the aforementioned reproduction clock signal to the A/D converter 5.

As apparent from the above, the PLL circuit 10 uses the PWM circuit 7 to convert a phase error signal to a pulse width modulation signal which has a pulse width corresponding to the value of this phase error signal, and acquires an average voltage level corresponding to the phase error signal based on the pulse width modulation signal. The above-described structure which uses the PWM circuit 7 can reduce consumed power and the implementation area as compared with the structure which uses a D/A converter to convert the phase error signal to an analog voltage.

Because the PWM circuit is designed to show the value of one phase error signal in terms of a pulse width modulation signal whose period is the reference pulse period N as shown in FIG. 3, the time equal to this reference pulse period N is needed to output a pulse width modulation signal corresponding to this one phase error signal. When the transitional period of the phase error signal becomes shorter than the reference pulse period N, then, phase error signals are supplied one after another while the pulse width modulation signal corresponding to one phase error signal is being output. Therefore, pulse width modulation signals which respond to those phase error signals cannot be output.

With the use of a phase error detector designed in such a way that the transitional period of the phase error signal is not constant and becomes shorter than the reference pulse period N specific to a PWM circuit, therefore, the use of the PWM circuit cannot reduce consumed power and the implementation area.

SUMMARY OF THE INVENTION

Accordingly, it is an object of the present invention to provide a digital PLL circuit which can permit voltage level conversion using pulse width modulation by a PWM circuit to thereby ensure lower power consumption and a smaller implementation area even when the transitional change of the phase error signal is not constant.

A digital PLL circuit according to this invention is for use in a recorded information reproducing apparatus having an A/D converter for sampling a read signal read from a recording medium at a timing corresponding to a reproduction clock signal to sequentially acquire sample values and decoding means for acquiring reproduced data based on the sample values, said circuit comprises: phase error detecting means for detecting a phase error in the read signal based on the sample values to obtain a phase error signal; phase error averaging means for producing an average phase error signal corresponding to an average value of the phase error signal; sample and hold means for sampling the average phase error signal for each predetermined clock signal and outputting a resultant signal as a sampled average phase error signal; a pulse width modulation circuit for generating a pulse width modulation signal having a pulse width corresponding to the sampled average phase error signal for every period of the predetermined clock signal; and clock generating means for generating a clock signal with a frequency corresponding to a voltage level of the pulse width modulation signal and outputting the clock signal as the reproduction clock signal.

With this structure, a read signal read from a recording medium is subjected to A/D conversion at a sampling timing corresponding to a reproduction clock signal to acquire sample values and a phase error in the read signal is detected based on the sample values. Next, the average value of the phase error signal corresponding to this detected phase error is obtained, and an average phase error signal corresponding to the average value is sampled and held at a predetermined clock timing. Then, this sampled and held average phase error signal is subjected to pulse width modulation for the predetermined clock timing to acquire a pulse width modulation signal, and a clock signal whose oscillation frequency corresponds to the voltage level of the obtained pulse width modulation signal is generated as the reproduction clock signal.

DETAILED DESCRIPTION OF THE PREFERRED EMBODIMENT

A preferred embodiment of the present invention will now be described referring to the accompanying drawings.

Figure 4:
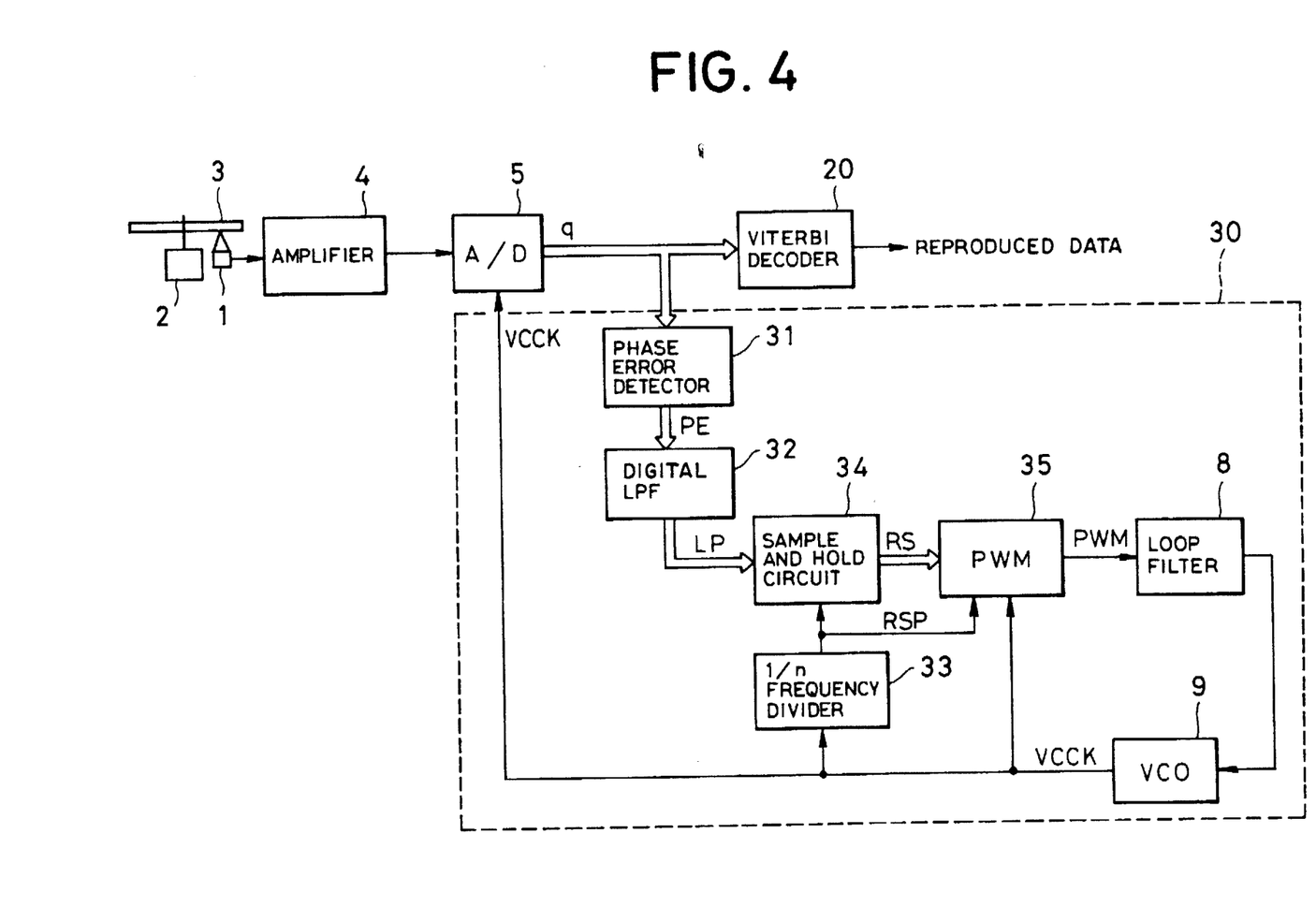
FIG. 4 is a diagram showing the structure of a recorded information reproducing apparatus equipped with a digital PLL circuit 30 according to this invention.

FIG. 4 shows the structure of a recorded information reproducing apparatus equipped with a digital PLL circuit 30 according to this invention.

In FIG. 4, a pickup 1 reads information recorded on a recording disk 3 which is rotated by a spindle motor 2, and supplies a read signal corresponding to the recorded information to a head amplifier 4. The head amplifier 4 amplifies the received read signal by a desired factor and sends the amplified read signal to an A/D converter 5. The A/D converter 5 samples the amplified read signal in accordance with the timing of a reproduction clock signal VCCK, supplied from the PLL circuit 30, to convert the amplified read signal to a digital sample value q, which corresponds to the signal level of the amplified read signal and consists of, for example, 8 bits. The A/D converter 5 supplies this sample value q to the PLL circuit 30 and a Viterbi decoder 20. The Viterbi decoder 20 treats the sample values q supplied from the A/D converter 5 as a continuous time sequence, acquires a decoded data sequence with the highest probability of existence with respect to the sample value sequence, and outputs the decoded data sequence as a reproduced data signal.

A phase error detector 31 in the PLL circuit 30 extracts a sample value of a level in the vicinity of zero from the sample values q which are sequentially supplied from the A/D converter 5, and detects a phase error in the read signal based on the extracted sample value. The phase error detector 31 supplies a digital phase error signal PE, which corresponds to the detected phase error and consists of, for example, 8 bits, to a digital LPF (Low-Pass Filter) 32.

Figure 5:
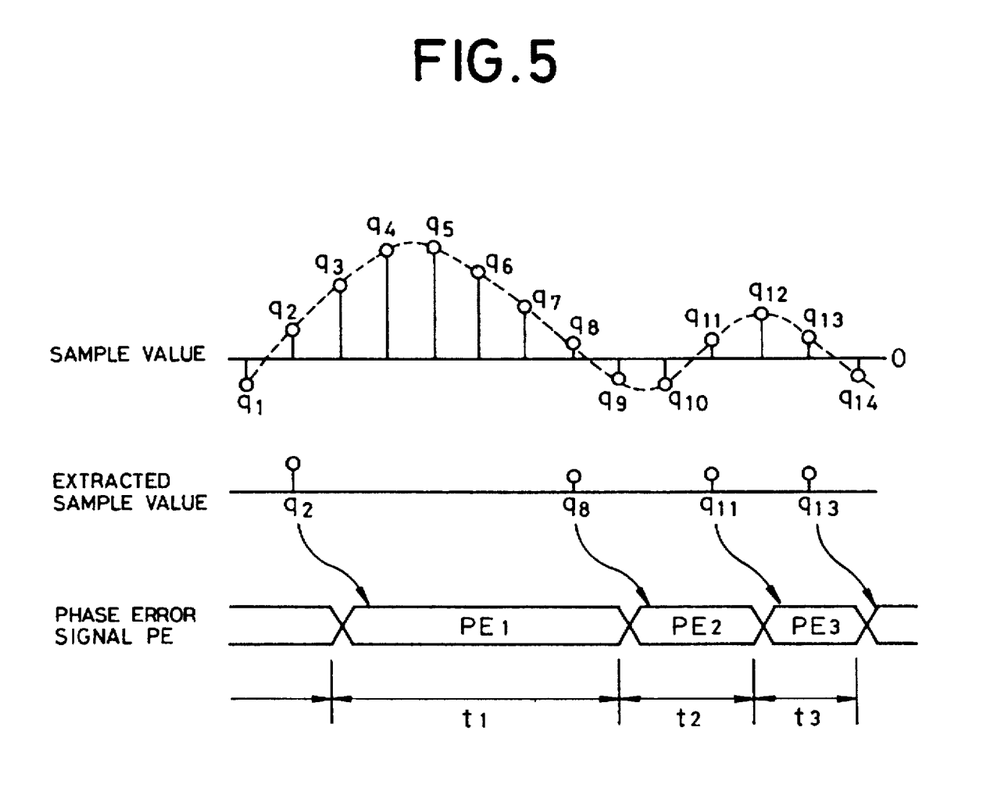
FIG. 5 is a diagram illustrating the operation of a phase error detector 31.

FIG. 5 presents a diagram illustrating an example of the operation of the phase error detector 31.

In FIG. 5, the A/D converter 5 sequentially supplies the sample values $q_1$ to $q_{14}$ to the phase error detector 31 in accordance with the read signal indicated by the broken line. Every time the read signal passes a zero-crossing point, the phase error detector 31 extracts the sample values $q_2$, $q_8$, $q_{11}$ and $q_{13}$, which lie at the sampling timings closest to such zero-crossing timing. The phase error detector 31 sends out the extracted sample value $q_2$ as a phase error signal $PE_1$, the extracted sample value $q_8$ as a phase error signal $PE_2$, and the extracted sample value $q_{11}$ as a phase error signal $PE_3$ at the respective timings illustrated in FIG. 5. Because the intervals between the individual zero-crossing points of the read signal correspond to the run lengths of recorded information recorded on the recording disk 3, the phase error detection and output periods $t_1$ to $t_3$ of the phase error detector 31 do not become a constant period as apparent from FIG. 5.

The digital LPF 32 acquires the value of the phase error signal PE supplied from the phase error detector 31 to yield an average phase error signal LP, and supplies this average phase error signal LP to a sample and hold circuit 34.

Figure 6:
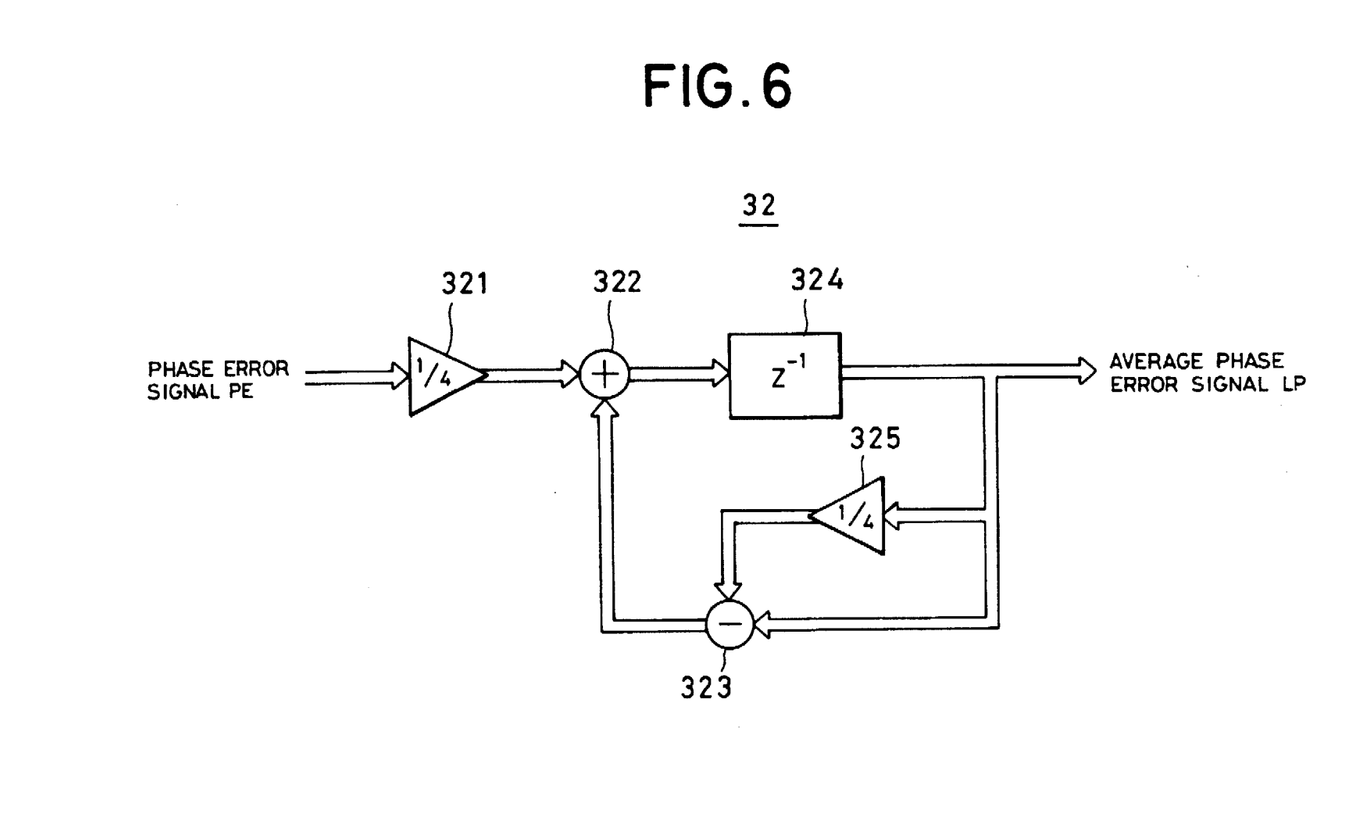
FIG. 6 is a diagram exemplifying the internal structure of a digital LPF 32.

FIG. 6 is a diagram exemplifying the structure of the digital LPF 32.

Referring to FIG. 6, a ¼ coefficient multiplier 321 supplies the result of the multiplication of the phase error signal PE from the phase error detector 31 by a coefficient "¼" to an adder 322. The adder 322 adds the multiplication result and a value supplied from a subtracter 323 which will be discussed shortly after, and outputs the addition result to delay means 324. The delay means 324 delays the addition result by a predetermined time and outputs the delayed result as the average phase error signal LP. A ¼ coefficient multiplier 325 supplies the result of the multiplication of the average phase error signal LP by a coefficient "¼" to the subtracter 323. The subtracter 323 subtracts the value, which is acquired by multiplying the average phase error signal LP by the coefficient "¼" in the ¼ coefficient multiplier 325, from the average phase error signal LP, and supplies the subtraction result to the adder 322. That is, the subtracter 323 and ¼ coefficient multiplier 325 yield a value, obtained by multiplying the average phase error signal LP by ¾, to be supplied to the adder 322.

More specifically, the digital LPF 32 having the structure as illustrated in FIG. 6 adds 75% of the average phase error signal LP previously output from this digital LPF 32 and 25% of the phase error signal PE currently supplied from the phase error detector 31 to acquire the average value of the phase error signal and supplies this average value as the average phase error signal LP to the sample and hold circuit 34.

A 1/n frequency divider 33 supplies a frequency-divided clock signal RSP, obtained by frequency-dividing the reproduction clock signal VCCK produced by a VCO 9 (which will be discussed later) to 1/n, to the sample and hold circuit 34 and a PWM circuit 35.

The sample and hold circuit 34 samples the value of the average phase error signal LP, supplied from the digital LPF 32, at, for example, the rising edge timing of the frequency-divided clock signal RSP, and holds the sampled value. While performing this sample and hold operation, the sample and hold circuit 34 supplies the sample value as a sampled average phase error signal RS to the PWM circuit 35.

The PWM circuit 35 generates a pulse width modulation signal PWM whose pulse width corresponds to the value of the sampled average phase error signal RS based on the reproduction clock signal VCCK at, for example, the rising edge timing of the frequency-divided clock signal RSP, and supplies the pulse width modulation signal PWM to a loop filter 8. In other words, the PWM circuit 35 generates the pulse width modulation signal PWM whose pulse width corresponds to the value of the sampled average phase error signal RS every one period of the frequency-divided clock signal RSP, which serves as a reference pulse period N in the PWM circuit 35, and supplies this pulse width modulation signal PWM to the loop filter 8.

The loop filter 8 performs phase compensation on this pulse width modulation signal PWM and supplies the resultant signal to the VCO 9. The VCO 9 generates a clock signal whose oscillation frequency corresponds to the average voltage level of the phase-compensated pulse width modulation signal PWM from the loop filter 8, and supplies this clock signal as the aforementioned reproduction clock signal VCCK to the A/D converter 5, the 1/n frequency divider 33 and the PWM circuit 35.

Figure 7:
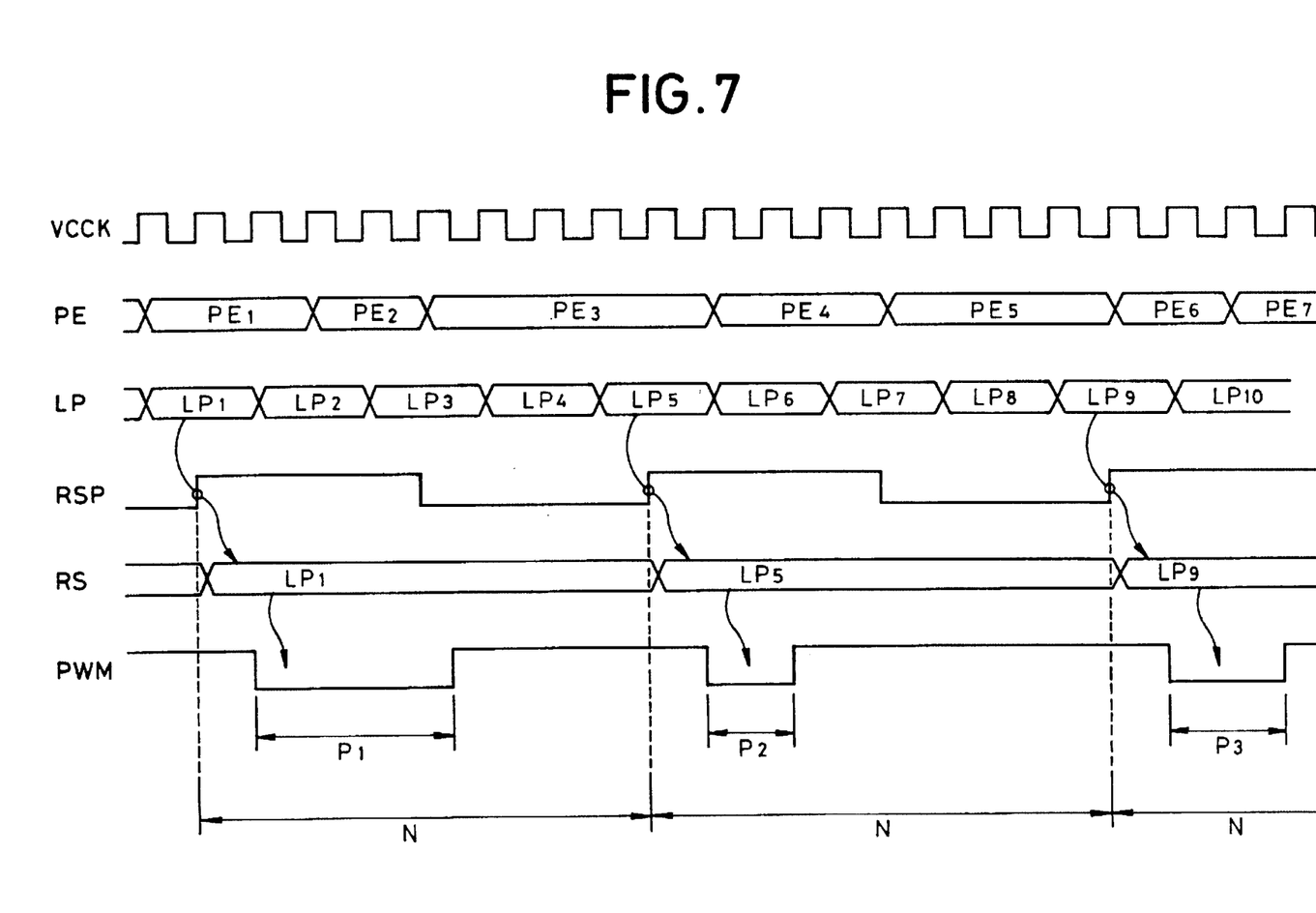
FIG. 7 is a diagram depicting an example of the internal operation of the digital PLL circuit 30 according to this invention.

FIG. 7 presents a diagram exemplifying the internal operation of the PLL circuit 30.

It is to be noted that the delay time of the delay means 324 in the digital LPF 32 is the duration of two clocks of the reproduction clock signal VCCK and the frequency-dividing factor of the 1/n frequency divider 33 is ⅛ in this internal operation.

In FIG. 7, the digital LPF 32 produces the average values of phase error signals $PE_1$–$PE_7$, sequentially supplied from the phase error detector 31, one by one at every timing of two clocks of the reproduction clock signal VCCK, and sequentially supplies average phase error signals $LP_1$–$LP_{10}$, obtained then, to the sample and hold circuit 34. The 1/n frequency divider 33 outputs a clock pulse, obtained by frequency-dividing the reproduction clock signal VCCK to ⅛, as the frequency-divided clock signal RSP. The sample and hold circuit 34 receives the average phase error signals $LP_1$, $LP_5$ and $LP_9$ lying at the rising edge timings of the frequency-divided clock signal RSP, from the aforementioned average phase error signals $LP_1$–$LP_{10}$, and supplies those signals $LP_1$, $LP_5$ and $LP_9$ each as the sampled average phase error signal RS to the PWM circuit 35. The PWM circuit 35 produces the pulse width modulation signal PWM having pulse widths $P_1$, $P_2$ and $P_3$, which respectively correspond to the values of the average phase error signals $LP_1$, $LP_5$ and $LP_9$, at the rising edge timings of the frequency-divided clock signal RSP.

According to this structure, as shown in FIG. 7, even if the transitional period of each of the phase error signals $PE_1$–$PE_7$ is not constant and is smaller than the reference pulse period N of the PWM circuit 35, it is possible to produce a pulse width modulation signal PWM which reflects the values of the phase error signals $PE_1$–$PE_7$.

In short, the digital PLL circuit embodying this invention performs A/D conversion on a read signal read from a recording medium at a sampling timing corresponding to a reproduction clock signal to acquire sample values, and detects a phase error in the read signal based on the sample values obtained then. Next, the average value of the phase error signal corresponding to this detected phase error is obtained, and an average phase error signal corresponding to the average value is sampled and held at a predetermined clock timing. Then, this sampled and held average phase error signal is subjected to pulse width modulation for the predetermined clock timing to acquire a pulse width modulation signal, and a clock signal whose oscillation frequency corresponds to the average voltage level of the obtained pulse width modulation signal is generated as the reproduction clock signal.

According to this invention, therefore, even if the transitional period of the phase error signal is not constant and is smaller than the reference pulse period of the PWM circuit, the PWM circuit can be used as means for acquiring a voltage level corresponding to the phase error signal. It is therefore possible to reduce the consumed power of the digital PLL circuit and accomplish the reduced implementation density thereof, advantageously.

What is claimed is:

1. A digital PLL circuit for use in a recorded information reproducing apparatus having an A/D converter for sampling a read signal read from a recording medium at a timing corresponding to a reproduction clock signal to sequentially acquire sample values and decoding means for acquiring reproduced data based on said sample values, said PLL circuit comprising:

phase error detecting means for detecting a phase error in said read signal based on said sample values to obtain a phase error signal;

phase error averaging means for producing an average phase error signal corresponding to said phase error signal;

sample and hold means for sampling said average phase error signal for each predetermined clock signal and outputting a resultant signal as a sampled average phase error signal;

a pulse width modulation circuit for generating a pulse width modulation signal having a pulse width corresponding to said sampled average phase error signal for every period of said predetermined clock signal; and clock generating means for generating a clock signal with a frequency corresponding to a voltage level of said pulse width modulation signal and outputting said clock signal as said reproduction clock signal.

2. The digital PLL circuit according to claim 1, wherein said predetermined clock signal is produced by frequency-dividing said reproduction clock signal by 1/n.

3. The digital PLL circuit according to claim 1, wherein said phase error averaging means acquires said average value by adding a value obtained by multiplying said phase error signal by a first coefficient and a value obtained by multiplying said average phase error signal, having been obtained a predetermined time earlier by said phase error averaging means, by a second coefficient greater than said first coefficient.

4. The digital PLL circuit according to claim 1, wherein said phase error detecting means extracts a sample value of a level in a vicinity of zero from sample values sequentially supplied from said A/D converter, and issues said extracted sample value as said phase error signal.

* * * * *